United States Patent
Han et al.

(10) Patent No.: US 7,318,870 B2
(45) Date of Patent: Jan. 15, 2008

(54) METHOD OF CLEANING SEMICONDUCTOR SUBSTRATE

(75) Inventors: Dong-Gyun Han, Yongin-shi (KR); Hyung-Ho Ko, Seoul (KR); Young-Jun Kim, Gyeongju-shi (KR); Ki-Jong Park, Yongin-shi (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 250 days.

(21) Appl. No.: 10/421,740

(22) Filed: Apr. 24, 2003

(65) Prior Publication Data

US 2003/0221705 A1 Dec. 4, 2003

(30) Foreign Application Priority Data

May 30, 2002 (KR) .................. 10-2002-0030416

(51) Int. Cl.
*B08B 7/00* (2006.01)

(52) U.S. Cl. ............... 134/6; 134/2; 134/3; 134/7; 134/30; 134/31; 134/42; 438/691; 438/692; 438/693

(58) Field of Classification Search .......... 134/2, 134/3, 19, 31, 6, 7, 30, 42; 216/38; 438/691–693, 438/906
See application file for complete search history.

(56) References Cited

U.S. PATENT DOCUMENTS

| | | | | |
|---|---|---|---|---|
| 5,571,367 A | * | 11/1996 | Nakajima et al. | 156/345.15 |
| 5,896,875 A | * | 4/1999 | Yoneda | 134/102.3 |
| 6,022,813 A | * | 2/2000 | Kobayashi et al. | 438/778 |
| 6,207,580 B1 | * | 3/2001 | Costaganna | 438/712 |
| 6,679,950 B2 | * | 1/2004 | Tomita et al. | 134/36 |
| 2002/0019135 A1 | * | 2/2002 | Chang | 438/692 |
| 2002/0134409 A1 | * | 9/2002 | Scovell | 134/61 |
| 2002/0155681 A1 | * | 10/2002 | Hu et al. | 438/471 |
| 2003/0064604 A1 | * | 4/2003 | Umeda | 438/745 |
| 2003/0145875 A1 | * | 8/2003 | Han et al. | 134/9 |
| 2004/0020513 A1 | * | 2/2004 | Bergman | 134/2 |

FOREIGN PATENT DOCUMENTS

| | | | |
|---|---|---|---|
| JP | 2000311880 | * | 11/2000 |
| JP | 2000331978 | * | 11/2000 |
| KR | 1998-0005766 | | 3/1998 |
| KR | 1999-000064 | | 1/1999 |
| WO | WO 01/07177 | * | 2/2001 |

OTHER PUBLICATIONS

Handbook of Semiconductor Wafer Cleaning Technology (W. Kern, 1993, p. 13, 24).*

* cited by examiner

*Primary Examiner*—M. Kornakov
(74) *Attorney, Agent, or Firm*—Harness, Dickey & Pierce, P.L.C.

(57) ABSTRACT

A cleaning method for a semiconductor substrate including placing the semiconductor substrate into a cleaning chamber and injecting ozone gas ($O_3$) into the cleaning chamber. This process operates to cleanse the semiconductor substrate without corrosion or etching of the semiconductor substrate; even when the substrate has metal layer made of tungsten.

5 Claims, 6 Drawing Sheets

METHOD OF CLEANING SEMICONDUCTOR SUBSTRATE

RELATED APPLICATION

This application claims priority from Korean Patent Application No. 10-2002-0030416, filed on May 30, 2002, the contents of which are herein incorporated by reference in their entirety.

FIELD OF THE INVENTION

The present invention generally relates to a method of cleaning a semiconductor substrate and, more specifically, to a cleaning method for removing organic residue from the semiconductor substrate.

BACKGROUND OF THE INVENTION

One role of a cleaning step in the fabrication of a semiconductor device is to remove contaminants. Contaminants generated while a material layer is etched have a negative influence on the operation of the device. Therefore, the contaminants should be removed.

Similarly, a fabrication process calling for a chemical mechanical polishing process (CMP process) for planarization, also generates contaminants. The contaminants resulting from the CMP process are primarily remaining slurry, organic residue etc.

The slurry may be placed between a wafer and a polishing pad and acts as a catalyzer for stimulating the polishing process during the CMP process. The slurry may continue to reside on the polished semiconductor substrate. Organic residue may also result from the polishing pad.

FIG. 1 is a schematical cross-sectional view illustrating a cleaning method performed after the conventional CMP process, and FIG. 2 is a flowchart illustrating a method of cleaning the semiconductor substrate of FIG. 1.

Referring to FIGS. 1 and 2, a device isolation layer 2 is formed at a semiconductor substrate 1 to define an active region. Thereafter, a gate pattern 6 is formed across the active region. The gate pattern 6 includes a gate insulation layer 3, a gate electrode 4, and a hardmask layer 5 which are sequentially stacked on the active region. The hardmask layer 5 is made of silicon nitride. Spacers 7 are formed on the both sidewalls of the gate pattern 6. An interlayer dielectric layer 8 is formed on an entire surface of the substrate including the spacers 7. A step difference of the interlayer dielectric layer 8 results from the gate pattern 6.

The interlayer dielectric layer 8 may be planarized by the CMP process until the hardmask layer 5 is exposed. As shown in FIG. 1, the CMP process may cause the remaining slurry A and the organic residue B (the contaminants) to be present on the interlayer dielectric layer 8. The remaining slurry A and the organic residue B are randomly located. A method of removing the remaining slurry A and the organic residue B is explained in the flowchart of FIG. 2.

First, the remaining slurry A is removed with a brush and then with diluted hydrogen fluoride (HF) at step S10. While the remaining slurry A is removed, the semiconductor substrate 1 rotates. The diluted hydrogen fluoride is a mixture of hydrogen fluoride (HF) and water ($H_2O$) at desired rates. The use of the brush and the diluted hydrogen fluoride may cause more organic residue B.

Next, the organic residue B is removed using piranha cleaning or standard cleaning 1 (SC1 cleaning) on the substrate 1 at step S20. The piranha cleaning is a cleaning method using a solution of sulfuric acid ($H_2SO_4$) and hydrogen peroxide ($H_2O_2$) at desired rates. The piranha cleaning removes the organic residue B causing dehydrogenation and oxidation between the mixed solution and the organic residue B. The SC1 cleaning removes the organic residue B using a solution of ammonia ($NH_4OH$), hydrogen peroxide ($H_2O_2$), and water ($H_2O$). The substrate 1 is then rinsed with the deionized water at step S30. The scum of the organic residue B and the solutions may be removed by a rinse.

Further, a line width of the gate electrode 4 decreases as more and more highly integrating semiconductor devices are desired. Thus a resistance of the gate electrode 4 increases, so that characteristics of a semiconductor device, such as a transistor, may be degraded. To decrease the resistance of the gate electrode 4, a method of cleaning a gate electrode 4 with a tungsten layer is therefore proposed.

However, if the gate electrode 4 is made of tungsten, the organic residue B may not be removed with the piranha cleaning and the SC1 cleaning, because the tungsten may be corroded or etched by the hydrogen peroxide used in the piranha and SC1 cleaning. In other words, the hydrogen peroxide penetrates the gate electrode 4 along the interfaces between the hardmask layer 5 and the spacer 7, and may corrode or etch the gate electrode 4. Therefore, the resistance may increase with damages to the gate electrode 4. In addition, hydrogen peroxide may corrode or etch the tungsten layer to form a particle and the tungsten layer may be exposed through clamp zones on the edge of the substrate 1. The clamp zone is the edges of the substrate 1 making contact with the clamp installed in a semiconductor fabricating apparatus.

Additionally, when a contact plug or a damascene interconnection is formed by performing the CMP process to the tungsten layer, the conventional cleaning methods (i.e., the piranha and the SC1 cleaning) may not be available.

SUMMARY OF THE INVENTION

According to exemplary embodiments of the present invention, methods are provided for the removal of organic residue without corrosion or etching of a semiconductor substrate; even where the substrate has a tungsten layer.

Therefore, an exemplary embodiment of the present invention provides a cleaning method for removing the organic residue on the semiconductor substrate. The method comprises placing the semiconductor substrate into a cleaning chamber. Once in the semiconductor substrate is in the chamber, Ozone gas ($O_3$) is injected into the cleaning chamber to remove the organic residue. After the cleaning process, the semiconductor substrate is removed from the cleaning chamber.

Referring to another exemplary embodiment of the present invention, an apparatus for enabling the cleaning method comprises a chamber that is capable of holding the semiconductor substrate while it is being cleaned. The chamber (cleaning chamber) has at least one inlet used to inject the ozone gas, or whatever cleaning agent is injected into the cleaning chamber to remove the contaminants.

BRIEF DESCRIPTION OF THE DRAWINGS

The above and other features and advantages of exemplary embodiments of the present invention will become readily apparent from the description that follows, with reference to the accompanying drawings, in which.

DETAILED DESCRIPTION OF THE EXEMPLARY EMBODIMENT

Figure 1:
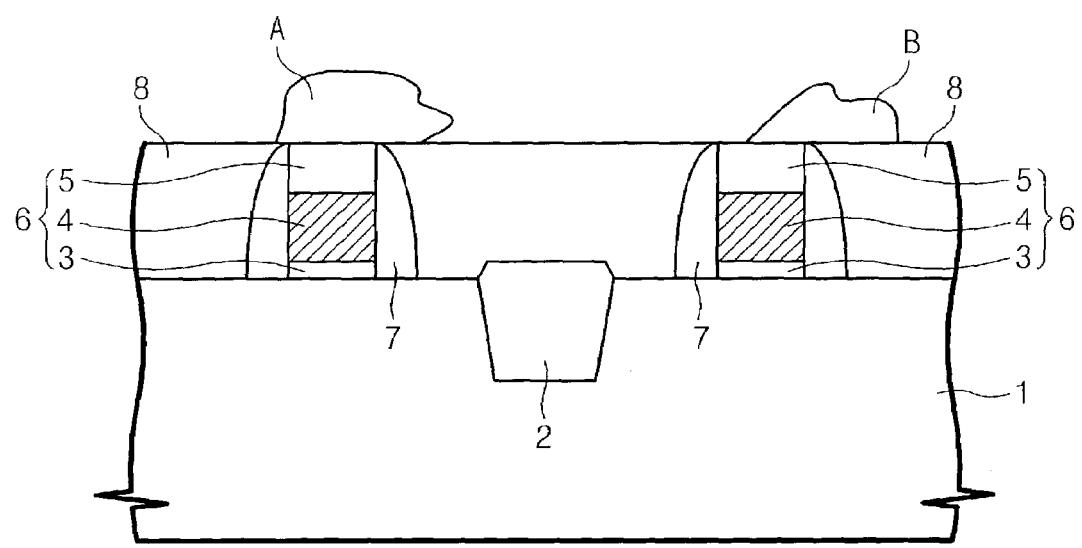
FIG. 1 is a schematical cross-sectional view illustrating a conventional cleaning method carried out after chemical mechanical polishing process.
Figure 2:
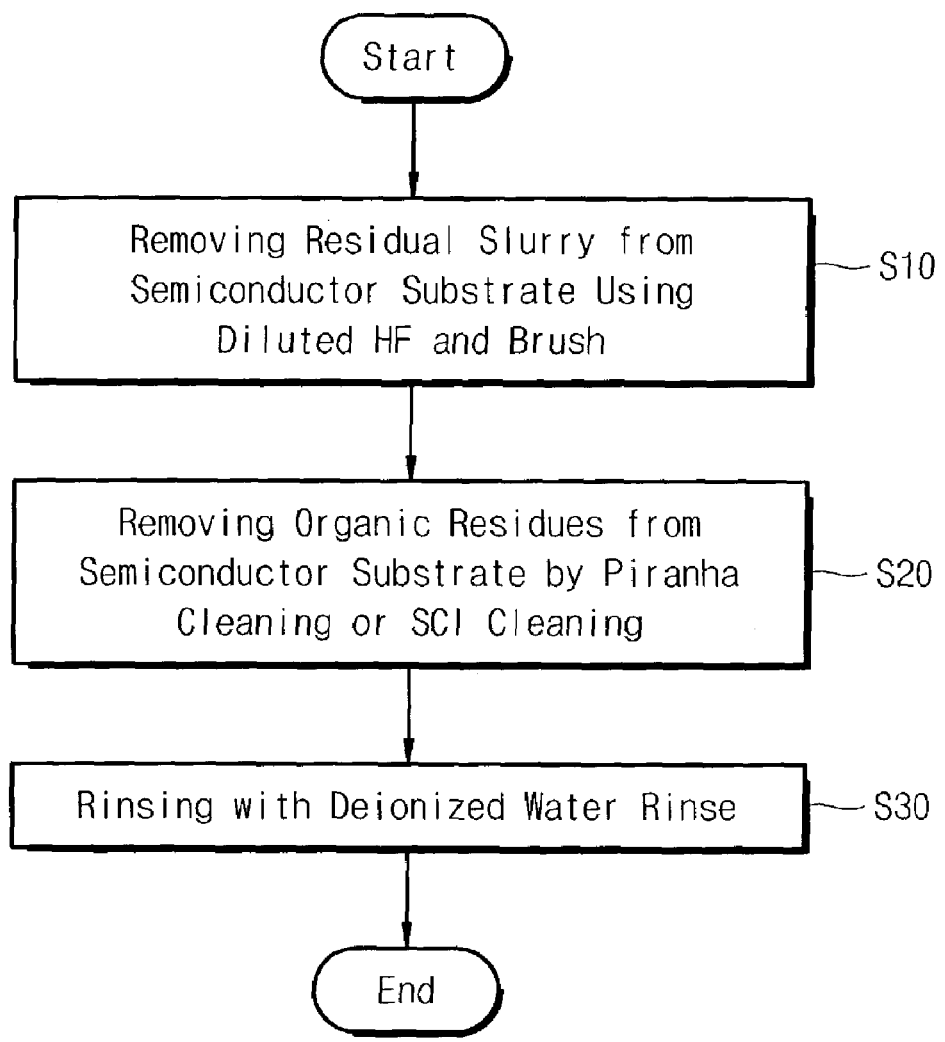
FIG. 2 is a flowchart illustrating cleaning method of a semiconductor substrate having the cross-sectional view of FIG. 1.

The present invention will be described more fully hereinafter with reference to the accompanying drawings, in which exemplary embodiments of the invention are shown. This invention, however, can be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Like numbers refer to like elements throughout.

Figure 3:
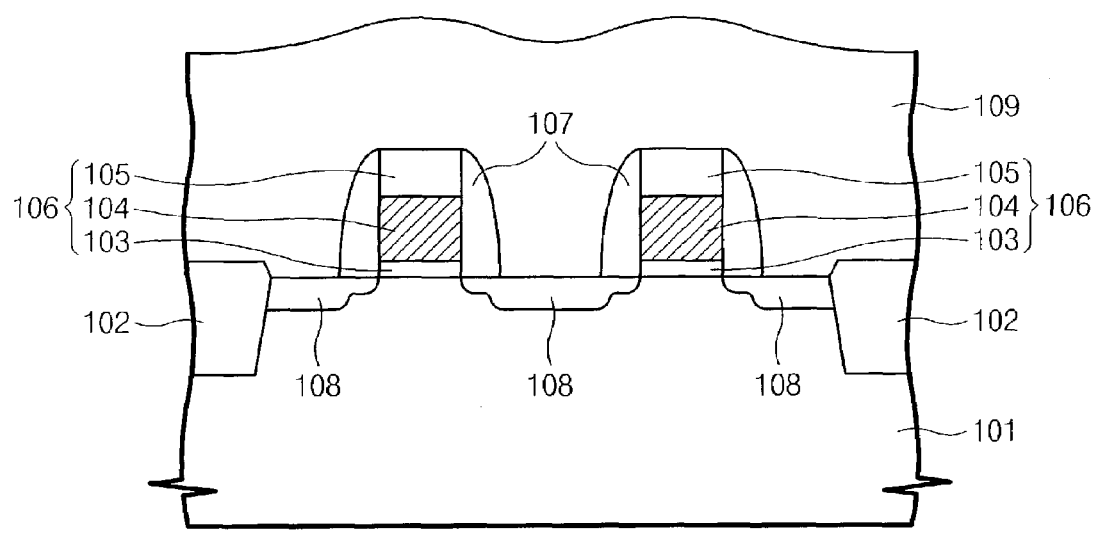
FIG. 3 and FIG. 4 are cross-sectional views illustrating cleaning methods of a semiconductor substrate in accordance with exemplary embodiments of the present invention.
Figure 5:
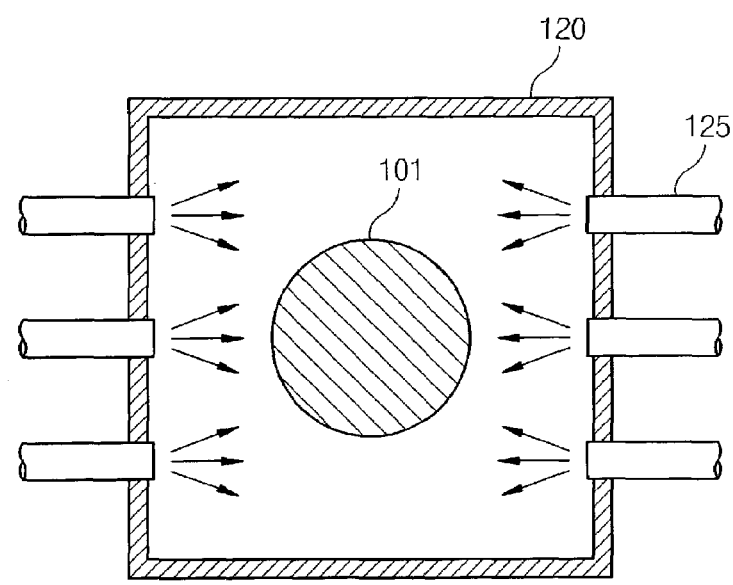
FIG. 5 schematically illustrates a cleaning apparatus used in the cleaning method of a semiconductor substrate in accordance with an exemplary embodiment of the invention.
Figure 6:
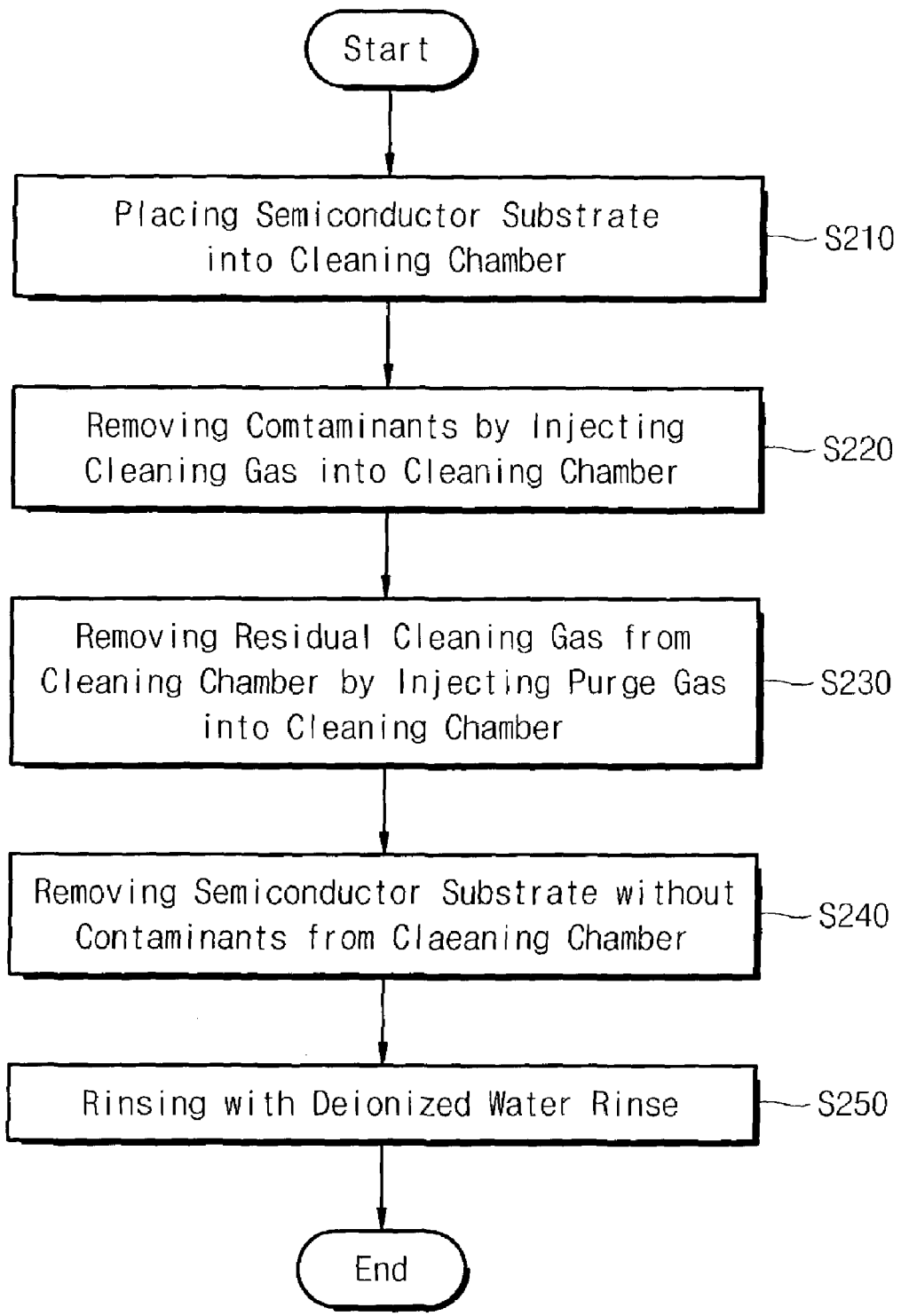
FIG. 6 is a flowchart illustrating a cleaning method of a semiconductor substrate having the cross-sectional view of FIG. 3.

Referring to FIGS. 3, 5 and 6, device isolation layers 102 defining an active region in the substrate 101 are formed in the semiconductor substrate 101 and then gate patterns 106, crossing the active region, are formed. The gate patterns 106 may include a gate insulator pattern 103, a gate electrode 104, and a hardmask pattern 105, respectively. The gate electrode 104 may be made of metal, for example tungsten. In an alternative exemplary embodiment, the tungsten gate electrode 104 has a diffusion barrier layer (not shown), for example metal nitride. This diffusion barrier layer may intervene between the gate electrode 104 and the gate insulation layer 103. In still another alternative embodiment, the gate electrode 104 may be formed from a doped polysilicon layer or polycide layer. The polycide layer may include sequentially stacked polysilicon and metal silicide.

An exemplary method for forming the gate pattern 106 is explained as follows. On the entire surface of the substrate 101 with the gate insulator, the layers of gate insulation, the layers of gate electrode, and the layers of hardmask are sequentially stacked and are successively patterned to form the hardmask 105 pattern, the gate electrode 104 and the gate insulation layer 103 pattern. The photoresist used in the patterning process may be made of organic material. Thus, when the photoresist is removed, an organic residue may be left on the substrate 101 having the gate pattern 106 after the patterning process. To alleviate such a situation, an exemplary method of removing the organic residue is illustrated in FIG. 6.

In an exemplary cleaning method of FIG. 6, the substrate 101 with the organic residue is placed in a cleaning chamber 120 at step S210. The cleaning chamber 120 has a closed inner space and at least one pipe 125 for injecting cleaning gas.

At step S220, the cleaning agent is injected into the cleaning chamber 120 through the cleaning-gas incoming pipe 125 so that the organic residue, a contaminant, is removed. In an exemplary embodiment, ozone gas ($O_3$ gas) is used as the cleaning agent. In another exemplary embodiment, ozone gas and deionized water vapor are used together as the cleaning agent. Still another exemplary embodiment uses the deionized water vapor as the cleaning agent. Thus, the ozone gas and/or the deionized water vapor are injected into the cleaning chamber 120 through the pipe 125. In another embodiment, the ozone gas and the deionized water vapor may be injected through different pipes 125. In still another exemplary embodiment, a concentration of the ozone gas is 10 to 100000 ppm, and a temperature in the chamber 120 is 80 to 150° C. In an exemplary embodiment, the chamber may be injected with only the ozone gas, which combines with the carbon in the organic residue to form the carbon dioxide (or carbon oxide). In an alternate embodiment, the agent (for example, deionized water vapor) attaches to the surface of the substrate 101 and the ozone gas melts into the deionized water vapor, such that the ozone gas contacts the organic residue. The organic residue includes carbon compound, which combines with the ozone gas to make carbon dioxide (or carbon oxide) and removes the organic residue. Using this method, the ozone gas and/or the deionized water vapor do not corrode or etch the gate electrode 104, even if the gate electrode 104 is a tungsten layer.

As a result, the corrosion or etching of the tungsten layer caused by the conventional piranha cleaning or standard cleaning 1(SC1) does not occur and characteristics of the gate electrode 104 are not degraded.

At step S230, purge gas is injected into the cleaning chamber 110 to remove the ozone gas and the deionized water vapor remaining in the cleaning chamber 110. Different exemplary embodiments may use an inert gas or air as the purge gas. Still another exemplary embodiment may use nitrogen ($N_2$) as the inert gas.

At step S240, substrate 101 is taken out of the chamber 120.

Finally, at step S250, the removed substrate 101 is rinsed with the deionized rinse. The rinse removes scum of the dissolved organic residue.

Other exemplary embodiments may dry the rinsed substrate 101. Thus, deionized water used as the rinse is cleaned from the substrate.

Similarly, in exemplary embodiments wherein the gate electrode 104 is formed of doped polysilicon layer or the polycide layer, the organic residue may be removed by the above explained method.

In another exemplary embodiment of a semiconductor substrate, the gate spacers 107 are formed on both sidewalls of the gate pattern 106 and the ion impurities may be implanted into active regions in both sides of the gate pattern 106 to form impurity diffusion layer 108. An interlayer dielectric layer (ILD) 109 may be formed on the entire surface of the substrate 101 with the impurity diffusion layer 108.

Figure 4:
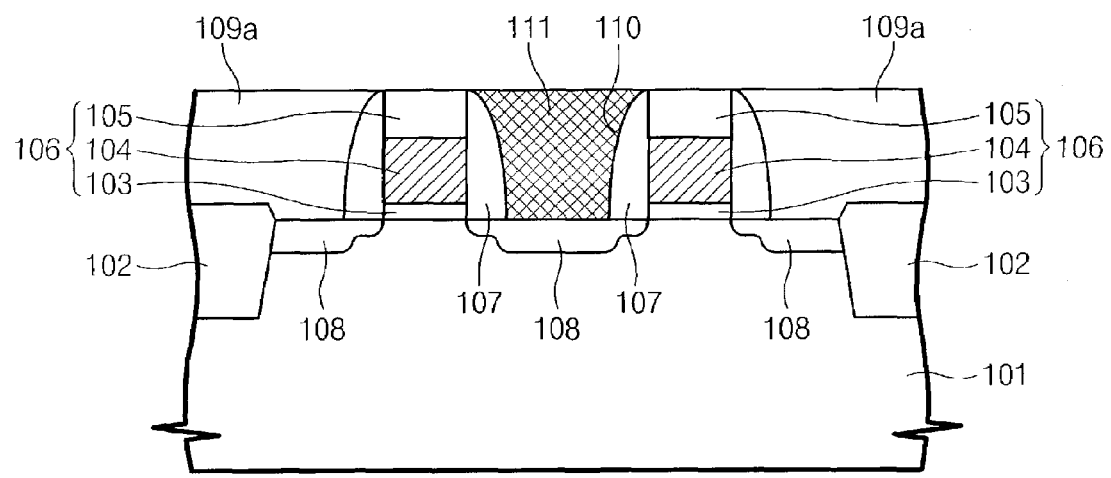
Figure 7:
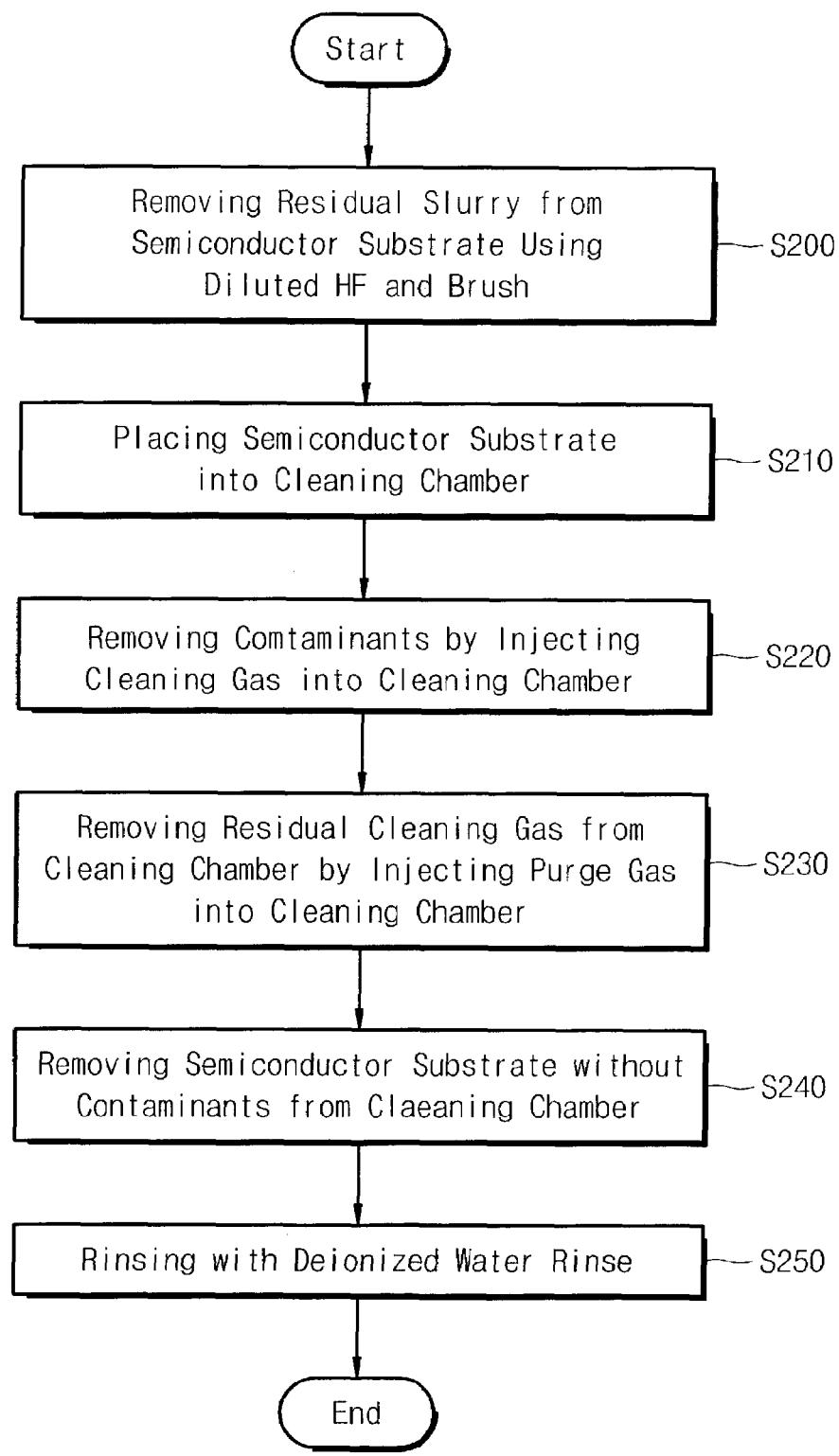
FIG. 7 is a flowchart illustrating a cleaning method of a semiconductor substrate having the cross-sectional view of FIG. 4.

Referring now to FIGS. 4, 5 and 7, the ILD 109 may be planarized until the hardmask pattern 105 is exposed to form an ILD pattern 109A. In an exemplary embodiment, a CMP process is used to carry out the planarizing process. When the CMP process is used, contaminants such as the remaining slurry, the organic residue, etc., may remain. A cleaning method for removing the remaining slurry and the organic residue is shown in FIG. 7.

At step S200, the remaining slurry is removed from the substrate 101 with a brush and diluted hydrogen fluoride (HF). The diluted HF may be a mixed solution of hydrogen fluoride and deionized water ($H_2O$) at a desired rate. To use the brush, the substrate 101 may be rotated. The diluted HF may be provided on the surface of the rotating substrate 101. A surface of the planarized ILD 109A under the remaining slurry is etched to separate the remaining slurry from the substrate 101 and the remaining slurry is removed from the substrate 101 with the brush.

In an exemplary embodiment, the organic residue is removed in a manner similar to the method for removing the organic residue from a photoresist after formation of the gate pattern 106 discussed above. Thus, the substrate 101, after the slurry is cleaned, is placed into the cleaning chamber 120 at step S210, and the organic residue is removed by injecting the cleaning gas into the chamber at step S220. Ozone gas may be used as the cleaning gas. In another exemplary embodiment, deionized vapor is injected into the chamber in combination with the ozone gas. In another exemplary embodiment, the concentration of the ozone gas is 10 ppm to 100000 ppm and/or the temperature in the chamber is 80° C. to 150° C. Afterwards, the purge gas is injected into the cleaning chamber 120 to remove the remaining ozone gas and/or the deionized water vapor at step S230 and the substrate 101 is removed from the chamber 120. The removed substrate 101 may be rinsed with the deionized rinse at step S250. As a result of this method, even if the gate electrode 104 is made of a tungsten metal layer, conventional corrosion or etching of the tungsten layer may be reduced.

Alternatively, the remaining slurry and the organic residue may be removed at the same time. In this exemplary embodiment, step S200 is not needed; (where the residual slurry is removed with the brush and the diluted HF). Instead, the HF gas is added to the cleaning gas. The substrate 101, contaminated with the remaining slurry and the organic residue, is placed into the cleaning chamber 120 and the ozone gas and the HF gas (with or without the deionized water vapor) are injected into the chamber 120. In an exemplary embodiment, the ozone gas oxidizes the surface of the planarized interlayer dielectric (ILD) 109A, i.e., the bottom contacting with the remaining slurry. The HF gas etches the oxidized layer on the ILD 109A to separate the remaining slurry from the ILD 109A. In addition, the ozone gas or the ozone gas and the deionized water vapor remove the organic residue. Therefore, the ozone gas, the deionized water vapor, and the HF gas isolate the remaining slurry from the substrate 101 and remove the organic residue at the same time. As a result, the step S200 may be omitted so that the fabricating steps are simplified and productivity improved. In an exemplary embodiment, the purge gas is injected into the cleaning chamber at step S230, and then, the substrate 101 is removed from the chamber 120 (S240), and rinsed with the deionized water (S250).

It should be noted, by patterning the planarized ILD 109A in yet another embodiment of fabrication, a self-aligned contact hole 110 may be formed, and then a metal layer filling the contact hole 110, for example tungsten layer, may be formed on the entire surface of the substrate 101. The tungsten layer may be planarized until the ILD 109A is exposed to form a self-aligned plug 111 filling the self-aligned contact hole 110.

The process of a planarizing the tungsten layer may be carried out using the CMP process. In this case, the organic residue and the remaining slurry (contaminants) are removed in the same manner as previously discussed cleaning methods after formation of the planarized ILD 109A. Thus, it is possible to reduce or eliminate corrosion or etching of the metal layer, unlike the conventional piranha cleaning or the SC1 cleaning.

As explained so far, in accordance with the exemplary embodiments of the present invention, the contaminant on the semiconductor substrate, the organic residue, is removed with the ozone gas or the ozone gas and the deionized water vapor to reduce or eliminate the metal layer from corroding or etching, even though the substrate has a metal layer made of tungsten.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of removing an organic residue comprising:
    forming a tungsten layer on a substrate;
    performing a chemical mechanical polishing on the tungsten layer; and
    after performing the chemical mechanical polishing, removing the organic residue generated from the chemical mechanical polishing using a mixture including ozone and deionized water vapor.

2. The method of claim 1, wherein removing the organic residue includes:
    placing the substrate into a chamber; and
    injecting the ozone and the deionized water vapor into the chamber.

3. The method of claim 2, further comprising injecting a hydrogen fluoride gas into the chamber when injecting the ozone and the deionized water vapor.

4. The method of claim 2, further comprising: removing the substrate from the chamber after removing the organic residue; and rinsing the substrate with deionized water.

5. The method of claim 2, further comprising: removing a slurry from the substrate using a brush and diluted HF acid prior to placing the substrate into the chamber.

* * * * *